(12) United States Patent
Park et al.

(10) Patent No.: US 10,070,515 B2
(45) Date of Patent: Sep. 4, 2018

(54) TRANSPARENT ELECTRODE USING AMORPHOUS ALLOY AND METHOD OF MANUFACTURING THE SAME

(71) Applicant: SAMSUNG ELECTRONICS CO., LTD., Suwon-si, Gyeonggi-do (KR)

(72) Inventors: Eun-soo Park, Suwon-si (KR); Keum-hwan Park, Seoul (KR); Ju-Ho Lee, Hwaseong-si (KR); Jin-man Park, Seoul (KR); Young-soo Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/175,510

(22) Filed: Jun. 7, 2016

(65) Prior Publication Data

US 2017/0048972 A1 Feb. 16, 2017

(30) Foreign Application Priority Data

Aug. 10, 2015 (KR) .................... 10-2015-0112679

(51) Int. Cl.
| | |
|---|---|
| *H05K 1/09* | (2006.01) |
| *H05K 1/02* | (2006.01) |
| *G09F 9/30* | (2006.01) |
| *H01L 31/0224* | (2006.01) |
| *H05K 3/06* | (2006.01) |

(52) U.S. Cl.
CPC .......... *H05K 1/0274* (2013.01); *G09F 9/301* (2013.01); *H01L 31/022466* (2013.01); *H05K 1/097* (2013.01); *H05K 3/06* (2013.01); *H05K 2201/0108* (2013.01); *H05K 2201/026* (2013.01)

(58) Field of Classification Search
CPC .. H05K 1/00; H05K 1/02; H05K 1/03; H05K 1/09; H05K 1/274; H05K 1/306; H05K 1/353; H05K 3/06; H05K 3/12; H05K 3/38; H05K 3/4644
USPC ......... 174/257, 126.1, 126.2, 250, 251, 253, 174/255; 427/97.4, 108; 428/195.1, 221, 428/605, 607; 361/748
See application file for complete search history.

(56) References Cited

U.S. PATENT DOCUMENTS

| | | | |
|---|---|---|---|
| 5,648,174 | A | 7/1997 | Yamagata et al. |
| 6,357,340 | B1 | 3/2002 | Kato et al. |
| 6,733,723 | B2 | 5/2004 | Choi et al. |
| 6,921,205 | B2 | 7/2005 | Kanayama et al. |
| 7,217,099 | B2 | 5/2007 | Casanova et al. |
| 7,387,501 | B2 | 6/2008 | Hirota |
| 7,456,138 | B2 | 11/2008 | Sherman et al. |
| 7,514,383 | B2 | 4/2009 | Bitterlich et al. |

(Continued)

FOREIGN PATENT DOCUMENTS

| | | |
|---|---|---|
| EP | 1 458 979 B1 | 9/2004 |
| JP | 7-180038 | 7/1995 |

(Continued)

*Primary Examiner* — Xiaoliang Chen
(74) *Attorney, Agent, or Firm* — Staas & Halsey LLP

(57) ABSTRACT

A transparent electrode using an amorphous alloy is provided. The transparent electrode includes a flexible substrate and an amorphous alloy layer configured to have conductivity and to be formed on the flexible substrate so as to have a plurality of voids.

10 Claims, 23 Drawing Sheets

(56) References Cited

U.S. PATENT DOCUMENTS

| | | | |
|---|---|---|---|
| 7,910,932 B2* | 3/2011 | Marks | B82Y 10/00 257/72 |
| 8,143,151 B2 | 3/2012 | Dutta | |
| 8,194,053 B2 | 6/2012 | Kim et al. | |
| 8,218,099 B2* | 7/2012 | Yamazaki | H01L 27/1225 349/19 |
| 8,455,414 B2 | 6/2013 | Sabahi et al. | |
| 8,748,749 B2* | 6/2014 | Srinivas | G06F 3/041 174/250 |
| 8,780,568 B2 | 7/2014 | Osako et al. | |
| 8,823,059 B2 | 9/2014 | Dewey et al. | |
| 8,912,120 B2 | 12/2014 | Yerkes et al. | |
| 8,921,473 B1* | 12/2014 | Hyman | C08K 3/04 423/445 R |
| 9,000,431 B2* | 4/2015 | Miyairi | H01L 29/42384 257/43 |
| 9,040,948 B2 | 5/2015 | Ribeiro et al. | |
| 9,102,570 B2* | 8/2015 | Joo | D01D 5/0069 |
| 9,230,707 B2 | 1/2016 | Chung et al. | |
| 9,472,788 B2* | 10/2016 | Collier | H01L 21/477 |
| 9,530,531 B2* | 12/2016 | Lin | H01B 1/04 |
| 2002/0025443 A1* | 2/2002 | Ohno | G11B 7/24 428/469 |
| 2003/0231815 A1 | 12/2003 | Takayasu et al. | |
| 2005/0029678 A1* | 2/2005 | Hanrath | B82Y 10/00 257/784 |
| 2007/0066495 A1 | 3/2007 | Macpherson | |
| 2007/0074316 A1* | 3/2007 | Alden | B82Y 20/00 257/784 |
| 2008/0088227 A1 | 4/2008 | Lee | |
| 2008/0143906 A1* | 6/2008 | Allemand | B82Y 10/00 349/43 |
| 2008/0170982 A1* | 7/2008 | Zhang | B82Y 10/00 423/447.3 |
| 2008/0259262 A1* | 10/2008 | Jones | B82Y 10/00 349/139 |
| 2008/0280069 A1 | 11/2008 | Parce et al. | |
| 2010/0028641 A1 | 2/2010 | Zhu et al. | |
| 2010/0197068 A1* | 8/2010 | Poon | H01L 31/02246 438/63 |
| 2010/0243295 A1* | 9/2010 | Allemand | B82Y 10/00 174/250 |
| 2011/0003279 A1* | 1/2011 | Patel | G01D 3/10 435/5 |
| 2011/0162870 A1* | 7/2011 | Markovich | C23C 18/14 174/126.1 |
| 2011/0203654 A1 | 8/2011 | Kihara et al. | |
| 2012/0255762 A1 | 10/2012 | Katagiri et al. | |
| 2013/0048339 A1* | 2/2013 | Tour | H01B 1/04 174/126.1 |
| 2013/0118775 A1* | 5/2013 | Zeng | D01F 9/08 174/126.2 |
| 2013/0196469 A1* | 8/2013 | Facchetti | C23C 18/1216 438/104 |
| 2013/0252101 A1 | 9/2013 | Zhou et al. | |
| 2013/0341074 A1* | 12/2013 | Virkar | B82Y 30/00 174/255 |
| 2013/0342221 A1 | 12/2013 | Virkar et al. | |
| 2014/0020737 A1* | 1/2014 | Jung | H01B 1/02 136/252 |
| 2014/0045680 A1 | 2/2014 | Nakayama et al. | |
| 2014/0231718 A1* | 8/2014 | Lin | H01B 1/04 252/503 |
| 2014/0235123 A1* | 8/2014 | Lin | G06F 3/041 442/1 |
| 2014/0238833 A1* | 8/2014 | Virkar | H03K 17/9622 200/600 |
| 2014/0262453 A1* | 9/2014 | Poon | H05K 3/12 174/253 |
| 2014/0272199 A1* | 9/2014 | Lin | H01L 51/444 427/600 |
| 2014/0332254 A1* | 11/2014 | Pellerite | H01B 1/02 174/251 |
| 2014/0342177 A1* | 11/2014 | Wiley | B82Y 30/00 428/605 |
| 2015/0008016 A1* | 1/2015 | Poon | H05K 1/0274 174/253 |
| 2015/0010695 A1* | 1/2015 | Poon | H05K 1/0296 427/97.4 |
| 2015/0030783 A1 | 1/2015 | Suganuma et al. | |
| 2015/0034368 A1 | 2/2015 | Yang et al. | |
| 2015/0047468 A1 | 2/2015 | Koo et al. | |
| 2015/0049409 A1 | 2/2015 | Choi et al. | |
| 2015/0059486 A1 | 3/2015 | Choong et al. | |
| 2015/0062465 A1 | 3/2015 | Her | |
| 2015/0068787 A1 | 3/2015 | Chung et al. | |
| 2015/0068790 A1 | 3/2015 | Kim et al. | |
| 2015/0069475 A1 | 3/2015 | Colinge et al. | |
| 2015/0070309 A1 | 3/2015 | Kang | |
| 2015/0070762 A1 | 3/2015 | An et al. | |
| 2015/0076106 A1 | 3/2015 | Pellerite et al. | |
| 2015/0090479 A1 | 4/2015 | Lee et al. | |
| 2015/0090958 A1 | 4/2015 | Yang et al. | |
| 2015/0091820 A1* | 4/2015 | Rosenberg | G06F 3/0414 345/173 |
| 2015/0091857 A1* | 4/2015 | Rosenberg | G06F 3/0414 345/174 |
| 2015/0091858 A1* | 4/2015 | Rosenberg | G06F 3/0414 345/174 |
| 2015/0091859 A1* | 4/2015 | Rosenberg | G06F 3/044 345/174 |
| 2015/0104936 A1* | 4/2015 | Markovich | H01L 31/02246 438/610 |
| 2015/0140287 A1* | 5/2015 | Poon | H01B 1/02 428/195.1 |
| 2015/0147573 A1* | 5/2015 | Zhang | B82Y 10/00 428/408 |
| 2015/0155430 A1* | 6/2015 | Li | H01L 51/5296 257/13 |
| 2015/0169111 A1 | 6/2015 | Hashimoto et al. | |
| 2015/0179297 A1 | 6/2015 | Stebbins | |
| 2015/0194232 A1 | 7/2015 | Matsuura et al. | |
| 2015/0206623 A1* | 7/2015 | Poon | H01B 1/02 427/123 |
| 2015/0208498 A1* | 7/2015 | Poon | H05K 1/092 361/748 |
| 2015/0231874 A1 | 8/2015 | Jin | |
| 2015/0232628 A1 | 8/2015 | Han et al. | |
| 2015/0235728 A1* | 8/2015 | Poon | H01B 1/02 428/221 |
| 2015/0308018 A1* | 10/2015 | Zhang | B82Y 10/00 156/167 |
| 2015/0359065 A1 | 12/2015 | Park et al. | |
| 2015/0359105 A1* | 12/2015 | Yoon | C09D 129/04 174/268 |
| 2016/0044777 A1 | 2/2016 | Seong et al. | |
| 2016/0095212 A1* | 3/2016 | Lee | H01L 21/26506 174/251 |
| 2016/0149153 A1* | 5/2016 | Scharner | H01L 51/5206 257/40 |
| 2016/0202801 A1* | 7/2016 | Odagiri | G06F 3/044 345/174 |

FOREIGN PATENT DOCUMENTS

| | | |
|---|---|---|
| JP | 8-87971 | 4/1996 |
| JP | 10-241464 | 9/1998 |
| JP | 2004-56097 | 2/2004 |
| JP | 2004-296669 | 10/2004 |
| JP | 2007-32360 | 2/2007 |
| JP | 2008-103305 | 5/2008 |
| JP | 2008-208394 | 9/2008 |
| JP | 2009-81104 | 4/2009 |
| JP | 2009-146678 | 7/2009 |
| JP | 2010-18878 | 1/2010 |
| JP | 2010-157681 | 7/2010 |
| JP | 2011-17269 | 1/2011 |
| KR | 1987-0001407 | 3/1987 |
| KR | 1991-0020326 | 12/1991 |
| KR | 1993-0002685 | 2/1993 |

(56) References Cited

FOREIGN PATENT DOCUMENTS

| | | |
|---|---|---|
| KR | 10-0156653 | 12/1995 |
| KR | 10-0193339 | 3/1996 |
| KR | 10-0189827 | 7/1996 |
| KR | 10-0161369 | 10/1996 |
| KR | 1997-0075375 | 12/1997 |
| KR | 10-0458693 | 3/1998 |
| KR | 1999-004277 | 1/1999 |
| KR | 1999-004278 | 1/1999 |
| KR | 1999-004279 | 1/1999 |
| KR | 1999-004280 | 1/1999 |
| KR | 1999-004281 | 1/1999 |
| KR | 1999-004283 | 1/1999 |
| KR | 10-0306069 | 6/1999 |
| KR | 10-0246436 | 7/1999 |
| KR | 1999-0077236 | 10/1999 |
| KR | 2000-0007405 | 2/2000 |
| KR | 2000-0065623 | 11/2000 |
| KR | 2001-0065704 | 7/2001 |
| KR | 2003-0001500 | 1/2003 |
| KR | 10-0378572 | 3/2003 |
| KR | 10-0436837 | 6/2004 |
| KR | 10-0438959 | 7/2004 |
| KR | 10 0186677 | 5/2005 |
| KR | 10-0492313 | 6/2005 |
| KR | 10-2005-0087006 | 8/2005 |
| KR | 10-2006-0004385 | 1/2006 |
| KR | 10-0556816 | 1/2006 |
| KR | 10-0619592 | 4/2006 |
| KR | 10-2006-0043852 | 5/2006 |
| KR | 10-0685330 | 2/2007 |
| KR | 10-2007-0033274 | 3/2007 |
| KR | 10-2007-0093640 | 9/2007 |
| KR | 10-2008-0065331 | 7/2008 |
| KR | 10-2009-0050183 | 5/2009 |
| KR | 10-2009-0060704 | 6/2009 |
| KR | 10-2009-0093081 | 9/2009 |
| KR | 10-0915059 | 9/2009 |
| KR | 10-2010-0063707 | 6/2010 |
| KR | 10-2011-0011802 | 2/2011 |
| KR | 10-2011-0084015 | 7/2011 |
| KR | 10-2011-0120479 | 11/2011 |
| KR | 10-1172553 | 8/2012 |
| KR | 10-1181548 | 9/2012 |
| KR | 10-1216463 | 12/2012 |
| KR | 10-2013-0016437 | 2/2013 |
| KR | 10-1230749 | 2/2013 |
| KR | 10-2013-0094049 | 8/2013 |
| KR | 10-1329892 | 11/2013 |
| KR | 10-2014-0027186 | 3/2014 |
| KR | 10-1386480 | 4/2014 |
| KR | 10-1396718 | 5/2014 |
| KR | 10-1433047 | 8/2014 |
| KR | 10-1453513 | 10/2014 |
| KR | 10-2014-0127051 | 11/2014 |
| KR | 10-2014-0132191 | 11/2014 |
| KR | 10-1465071 | 11/2014 |
| KR | 10-1465609 | 11/2014 |
| KR | 10-2015-0007574 | 1/2015 |
| KR | 10-2015-0009315 | 1/2015 |
| KR | 10-2015-0009950 | 1/2015 |
| KR | 10-2015-0010120 | 1/2015 |
| KR | 10-1481387 | 1/2015 |
| KR | 10-1481529 | 1/2015 |
| KR | 10-1482702 | 1/2015 |
| KR | 10-1482780 | 1/2015 |
| KR | 10-1484771 | 1/2015 |
| KR | 10-1485858 | 1/2015 |
| KR | 10-2015-0011410 | 2/2015 |
| KR | 10-2015-0011602 | 2/2015 |
| KR | 10-2015-0012620 | 2/2015 |
| KR | 10-2015-0012929 | 2/2015 |
| KR | 10-2015-0013292 | 2/2015 |
| KR | 10-2015-0013639 | 2/2015 |
| KR | 10-2015-0016119 | 2/2015 |
| KR | 10-2015-0019427 | 2/2015 |
| KR | 10-2015-0019993 | 2/2015 |
| KR | 10-2015-0020452 | 2/2015 |
| KR | 10-1489161 | 2/2015 |
| KR | 10-1490173 | 2/2015 |
| KR | 10-1490405 | 2/2015 |
| KR | 10-1496250 | 2/2015 |
| KR | 10-2015-0022232 | 3/2015 |
| KR | 10-2015-0022419 | 3/2015 |
| KR | 10-2015-0022905 | 3/2015 |
| KR | 10-2015-0024572 | 3/2015 |
| KR | 10-2015-0025091 | 3/2015 |
| KR | 10-2015-0025184 | 3/2015 |
| KR | 10-2015-0027042 | 3/2015 |
| KR | 10-2015-0027174 | 3/2015 |
| KR | 10-2015-0027341 | 3/2015 |
| KR | 10-2015-0028125 | 3/2015 |
| KR | 10-2015-0028471 | 3/2015 |
| KR | 10-2015-0028543 | 3/2015 |
| KR | 10-2015-0029188 | 3/2015 |
| KR | 10-2015-0029200 | 3/2015 |
| KR | 10-2015-0029395 | 3/2015 |
| KR | 10-2015-0029546 | 3/2015 |
| KR | 10-2015-0029817 | 3/2015 |
| KR | 10-2015-0030596 | 3/2015 |
| KR | 10-2015-0031844 | 3/2015 |
| KR | 10-2015-0032150 | 3/2015 |
| KR | 10-2015-0032291 | 3/2015 |
| KR | 10-1498186 | 3/2015 |
| KR | 10-1500785 | 3/2015 |
| KR | 10-1502870 | 3/2015 |
| KR | 10-1505471 | 3/2015 |
| KR | 10-1505512 | 3/2015 |
| KR | 10-1506694 | 3/2015 |
| KR | 10-2015-0033497 | 4/2015 |
| KR | 10-2015-0034221 | 4/2015 |
| KR | 10-2015-0034332 | 4/2015 |
| KR | 10-2015-0034429 | 4/2015 |
| KR | 10-2015-0034993 | 4/2015 |
| KR | 10-2015-0036304 | 4/2015 |
| KR | 10-2015-0036902 | 4/2015 |
| KR | 10-2015-0038268 | 4/2015 |
| KR | 10-2015-0039488 | 4/2015 |
| KR | 10-2015-0040086 | 4/2015 |
| KR | 10-2015-0040396 | 4/2015 |
| KR | 10-2015-0040666 | 4/2015 |
| KR | 10-2015-0040865 | 4/2015 |
| KR | 10-2015-0041527 | 4/2015 |
| KR | 10-2015-0041863 | 4/2015 |
| KR | 10-2015-0041866 | 4/2015 |
| KR | 10-2015-0042369 | 4/2015 |
| KR | 10-1507930 | 4/2015 |
| KR | 10-1508517 | 4/2015 |
| KR | 10-1509110 | 4/2015 |
| KR | 10-1510258 | 4/2015 |
| KR | 10-1510801 | 4/2015 |
| KR | 10-1511060 | 4/2015 |
| KR | 10-1511996 | 4/2015 |
| KR | 10-1512220 | 4/2015 |
| KR | 10-1512412 | 4/2015 |
| WO | WO 2013/099135 A1 | 7/2013 |
| WO | WO 2014/018201 A1 | 1/2014 |

\* cited by examiner

TRANSPARENT ELECTRODE USING AMORPHOUS ALLOY AND METHOD OF MANUFACTURING THE SAME

CROSS-REFERENCE TO RELATED APPLICATIONS

This application claims priority from Korean Patent Application No. 10-2015-0112679, filed on Aug. 10, 2015, in the Korean Intellectual Property Office, the disclosure of which is incorporated herein by reference in its entirety.

BACKGROUND OF THE INVENTION

1. Field of the Invention

Apparatuses and methods consistent with the present invention relate to a transparent electrode using an amorphous alloy and a method of manufacturing the same, and more particularly, to a transparent electrode using an amorphous alloy as a conductive layer thereof and a method of manufacturing the same.

2. Description of the Related Art

Transparent electrode substrates having transparent conductive layers have been actively used in various types of solar batteries, touch panels, portable phones, electrode papers, etc. including organic electroluminescence (EL) devices, organic solar batteries, etc. In particular, a transparent electrode substrate, on which a transparent conductive layer is formed on a transparent substrate such as a glass substrate or the like, has been generally used as an electrode of an electronic device such as a solar battery, an organic EL device, or the like.

Conductive layers of most transparent electrodes that are currently used in industries are materials that are manufactured by using tin oxide ($SnO_2$) as Indium Tin Oxide (ITO) in indium oxide ($In_2O_3$). The ITO is an oxide that shows an optical characteristic in a visible ray area, shows a reflection characteristic in an infrared area, has a relatively low electrical resistance, and is stable at a room temperature, and has been mainly used in a transparent electrode part of a touch panel, a liquid crystal display (LCD), an organic light-emitting diode (OLED), or the like. However, using ITO as a conductive layer of a transparent electrode increases unit cost for manufacturing the transparent electrode. Also, a transparent electrode substrate that uses a metal oxide layer, such as general ITO or the like, as a transparent conductive layer has a low surface resistance ratio and a high volume resistance ratio of the ITO.

Also, an organic EL device, various types of solar batteries, a touch panel, a portable phone, electronic paper, or the like requires a transparent conductive substrate having a surface resistance ratio lower than or equal to about 5 $\Omega/cm^2$. According to the requirement, a transparent electrode substrate that uses a metal material layer having an extremely lower volume resistance ratio than a transparent conductive layer as a sub electrode has been considered. However, additional improvements are required in a transparency, conductivity, and a durability of a transparent electrode. Therefore, there is a need for technologies for manufacturing a transparent electrode by using a material having an improved characteristic in comparison with an existing transparent electrode.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a transparent electrode using an amorphous alloy as a conductive layer thereof and a method of manufacturing the same.

According to an aspect of the present invention, a transparent electrode includes a flexible substrate, and an amorphous alloy layer configured to have conductivity and to be formed on the flexible substrate so as to have a plurality of voids.

The amorphous alloy layer may be formed of a plurality of amorphous alloy nano-wires.

A diameter of each of the amorphous alloy nano-wires may be greater than or equal to 10 nm and smaller than or equal to 500 nm.

The amorphous alloy layer may include a preset area formed in a plurality of protruding shapes.

A thickness of the amorphous alloy layer may be thicker than or equal to 5 nm and thinner than or equal to 10 μm.

The flexible substrate may be formed of at least one selected from thin glass, fiber-reinforced plastic (FRP), polyimide (PI), and polynorbornene (PNB).

The amorphous alloy layer may include a protection layer configured to be disposed in the plurality of voids.

An amorphous alloy may include at least one selected from iron (Fe), copper (Cu), zirconium (Zr), titanium (Ti), hafnium (Hf), zinc (Zn), aluminum (Al), sliver (Ag), and gold (Au).

The amorphous alloy layer may include an amorphous alloy complex that is formed through a reaction between an amorphous alloy and a nitrogen gas.

The amorphous alloy complex may include a crystalline phase higher than or equal to 10 atomic percent % (at. %) and lower than or equal to 90 at. %. A size of each of crystal grains of the crystalline phase may be greater than or equal to 5 nm and smaller than or equal to 1000 nm.

According to another aspect of the present invention, a method of manufacturing a transparent electrode, includes providing a flexible substrate, and forming an amorphous alloy layer including a plurality of voids on the flexible substrate.

The forming of the amorphous alloy layer may include providing a plurality of amorphous alloy nano-wires, and coating the plurality of amorphous alloy nano-wires on the flexible substrate.

The providing of the amorphous alloy nano-wires may include passing an amorphous alloy wire connected to an anode through at least one frame, which has a gradationally changing diameter and is connected to a cathode, in an electrolyte to manufacture an amorphous alloy nano-wire, cleaning the manufactured amorphous alloy nano-wire, and cutting the cleaned amorphous alloy nano-wire to a preset length.

The electrolyte may be a mixture of perchloric acid and ethyl alcohol.

The forming of the amorphous alloy layer may include forming a pattern defining an amorphous alloy deposition area on the flexible substrate, depositing an amorphous alloy layer on the flexible substrate on which the pattern is formed, and etching an area except (other than) the amorphous alloy deposition area.

Ceramic complex particles may be coated in the area except (other than) the amorphous alloy deposition area on the flexible substrate to form the pattern. The etching may include etching the ceramic complex particles.

The ceramic complex particles may be or include at least one selected from zirconium nitride (ZrN), titanium nitride (TiN), and aluminum nitride (AlN).

The forming of the pattern may include attaching a film, which is patterned to expose the area except (other than) the amorphous alloy deposition area, onto an upper surface of the flexible substrate, forming a material layer reacting with acid in an exposed area of the film, and removing the film.

The forming of the pattern may include forming a protection layer on the upper surface of the flexible substrate, forming a material layer reacting with acid on an upper surface of the protection layer, and removing the protection layer and the material layer formed on the amorphous alloy deposition area.

The forming of the amorphous alloy layer may include depositing the amorphous alloy layer, imprinting a mold, which is formed by patterning an area except (other than) the amorphous alloy deposition area in a protruding shape, on the deposited amorphous alloy layer, and etching the area except (other than) the amorphous alloy deposition area of the imprinted amorphous alloy layer.

Additional and/or other aspects and advantages of the invention will be set forth in part in the description which follows and, in part, will be obvious from the description, or may be learned by practice of the invention.

BRIEF DESCRIPTION OF THE DRAWINGS

The above and/or other aspects of the present invention will be more apparent by describing certain exemplary embodiments of the present invention with reference to the accompanying drawings, in which.

DETAILED DESCRIPTION OF THE PREFERRED EMBODIMENTS

Figure 1:
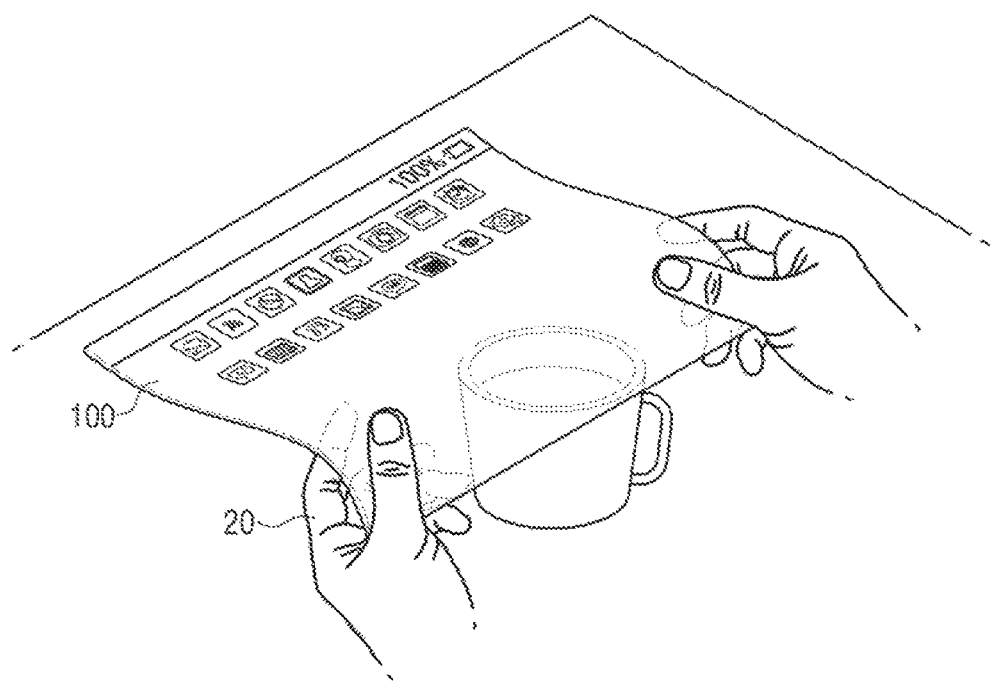
FIG. 1 illustrates a transparent display apparatus using a transparent electrode according to an exemplary embodiment of the present invention.

Certain exemplary embodiments of the present invention will now be described in greater detail with reference to the accompanying drawings.

In the following description, same drawing reference numerals are used for the same elements even in different drawings. The matters defined in the description, such as detailed construction and elements, are provided to assist in a comprehensive understanding of the invention. Thus, it is apparent that the exemplary embodiments of the present invention can be carried out without those specifically defined matters. Also, well-known functions or constructions are not described in detail since they would obscure the invention with unnecessary detail.

Also, the expression "comprising an element" means that another element may be further included not excluding another element as long as there is no particularly contrary description. In addition, various types of elements and areas are schematically drawn in the drawings. Therefore, the spirit of the present invention is not limited by relative sizes or distances drawn in the attached drawings.

The exemplary embodiments of the present disclosure may be diversely modified. Accordingly, specific exemplary embodiments are illustrated in the drawings and are described in detail in the detailed description. However, it is to be understood that the present disclosure is not limited to a specific exemplary embodiment, but includes all modifications, equivalents, and substitutions without departing from the scope and spirit of the present disclosure. Also, well-known functions or constructions are not described in detail since they would obscure the disclosure with unnecessary detail.

FIG. 1 illustrates a transparent display apparatus 100 using a transparent electrode according to an exemplary embodiment of the present invention.

Referring to FIG. 1, the transparent display apparatus 100 using the transparent electrode is flexible. The transparent display apparatus 100 may receive a command through a touch performed by a finger 20 of a user. The touch that is performed by the finger 20 of the user is illustrated in FIG. 1, but an input may be sensed through various types of input sources such as a stylus pen, etc. Also, the transparent display apparatus 100 may be folded or rolled in a scroll to be used. The transparent display apparatus 100 includes one transparent display unit as shown in FIG. 1 but may include a plurality of transparent display units.

Figure 2:
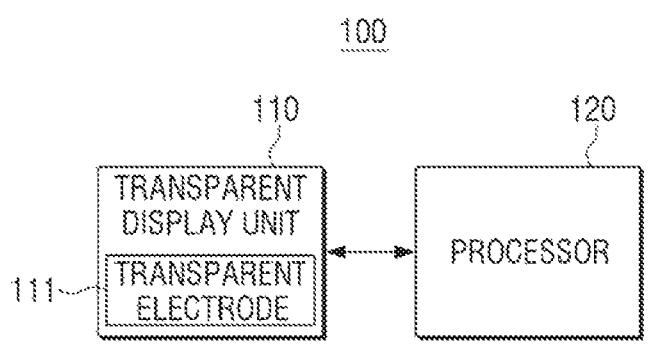
FIG. 2 is a block diagram of a detailed configuration of the transparent display apparatus of FIG. 1.

FIG. 2 is a block diagram of a detailed configuration of the transparent display apparatus 100 of FIG. 1.

Referring to FIG. 2, the transparent display apparatus 100 includes a transparent display unit 110 and a processor 120. In detail, the transparent display unit 110 includes a transparent electrode 111. Various types of elements, such as a storage unit, an audio output unit, a user interface (UI) unit, etc., are omitted for convenience of description but may be included.

If the user touches the transparent display unit 110, the transparent electrode 111 of the transparent display unit 110 may sense a generated current to receive the touch of the user. The transparent display unit 110 may also display a content or a screen operation corresponding to an input of the user.

The processor 120 may control the transparent display unit 110 to display a content or a screen operation corresponding to the touch sensed by the transparent electrode 111 of the transparent display unit 110.

The transparent electrode 111 of the transparent display unit 110 of the transparent display apparatus 100 will now be described according to various exemplary embodiments of the present invention.

Figure 3:
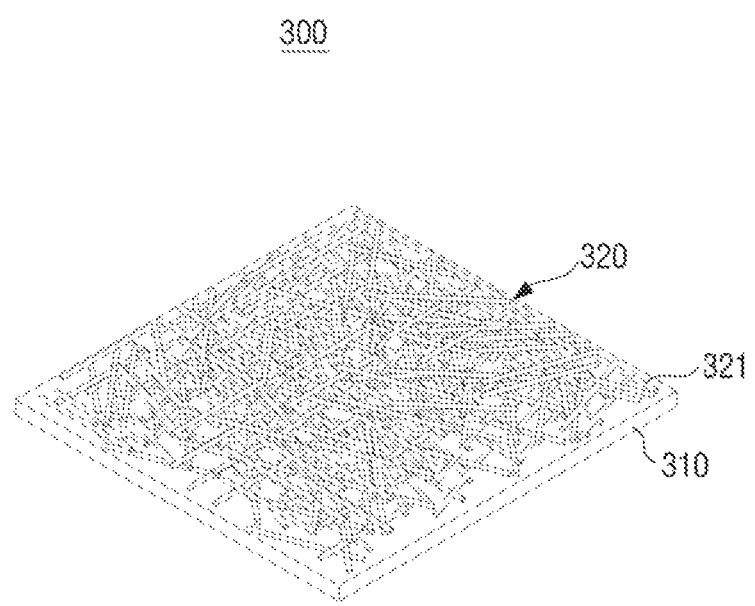
FIGS. 3 through 5 illustrate a transparent electrode according to various exemplary embodiments of the present invention.

FIG. 3 is a perspective view of a transparent electrode 300, according to an exemplary embodiment of the present invention.

Referring to FIG. 3, the transparent electrode 300 according to the present exemplary embodiment includes a flexible substrate 310 and an amorphous alloy layer 320. Here, the amorphous alloy layer 320 may include a plurality of amorphous alloy nano-wires 321.

Here, the flexible substrate 310 is a substrate that is transparent and bent so as to realize a flexible transparent display. A plastic substrate, thin glass, or a metal thin film, which is formed of a polymer film such as fiber-reinforced plastic (FRP), polyimide (PI), polynorbornene (PNB) or the like, may be used as the flexible substrate 310.

The amorphous alloy layer 320 is a layer that is formed by using an amorphous alloy and may be formed to a thickness thicker than or equal to 5 nm and thinner than or equal to 10

Here, the amorphous alloy refers to metal having metal atoms that are disorderedly arranged in comparison with metal crystal having metal atoms that are arranged periodically and regularly in a wide range.

General metal crystal has periodically arranged atoms and is easily modified to be easily processed but has a weak strength.

An amorphous alloy has a homogeneous isotropic characteristic in which there are no anisotropy, a grain boundary, surface detect, segregation, etc. appearing in a general crystal structure alloy.

In comparison with the general crystal structure alloy, the amorphous alloy does not have crystallographic anisotropy and thus has a high mechanical strength, a high electrical conductivity, and a high corrosion resistance resulting from uniform structure and composition.

Also, metal crystal has crystal grains and thus is limited to be patterned to a size smaller than or equal to the crystal grains. However, the amorphous alloy has very small crystal grains or does not have crystal grains and thus is not limited to a patterning size and may be patterned as it is wanted to be.

The amorphous alloy may be manufactured by using a liquid rapid cooling method of rapidly cooling liquid metal, which is melted by applying heat to a crystal structure alloy, for an extremely short time. Also, the amorphous alloy may also be manufactured by using a vacuum deposition method or a sputtering method of directly making metal into gas to directly form an amorphous alloy.

An amorphous alloy used in an exemplary embodiment of the present invention has crystal grains each having a size smaller than or equal to 1 nm and an amorphous content exceeding 50 atomic % (at. %), i.e., an amorphous content exceeding 90 at. %, e.g., an amorphous content exceeding 99 at. %.

An amorphous alloy including at least one selected from zinc (Zn), aluminum (Al), and copper (Cu) is used in an exemplary embodiment of the present invention but is not limited thereto. The amorphous alloy may include at least one selected from alloy elements such as iron (Fe), cobalt (Co), nickel (Ni), magnesium (Mg), tin (Sn), palladium (Pd), phosphorus (P), beryllium (Be), niobium (Nb), gallium (Ga), silicon (Si), boron (B), carbon (C), hafnium (Hf), zirconium (Zr), titanium (Ti), etc.

The amorphous alloy layer 320 may include an amorphous alloy complex.

An amorphous alloy reacts with a nitrogen gas to manufacture the amorphous alloy complex. The amorphous alloy complex may have an amorphous content higher than or equal to 10 at. % and lower than or equal to 90 at. %, and a crystalline structure includes crystal grains each having a size greater than or equal to 5 nm and smaller than or equal to 1000 nm.

Also, the amorphous alloy nano-wires 321 configuring the amorphous alloy layer 320 of the transparent electrode 300 according to an exemplary embodiment of the present invention may each have an aspect ratio higher than or equal to 1000 and a uniform diameter smaller than or equal to 500 nm. The diameter of each of the amorphous alloy nano-wires 321 may be greater than or equal to 10 nm and smaller than or equal to 500 nm. Here, the aspect ratio refers to a ratio that represents a relation between a diameter and a length of an amorphous alloy nano-wire.

A method of manufacturing the transparent electrode 300 by using the amorphous alloy nano-wires 321 according to the exemplary embodiment of the present invention will be described in detail later with reference to FIG. 7.

A method of manufacturing the amorphous alloy nano-wires 321 used in the transparent electrode 300 according to the exemplary embodiment of the present invention will be described in detail later with reference to FIG. 8.

Figure 4:
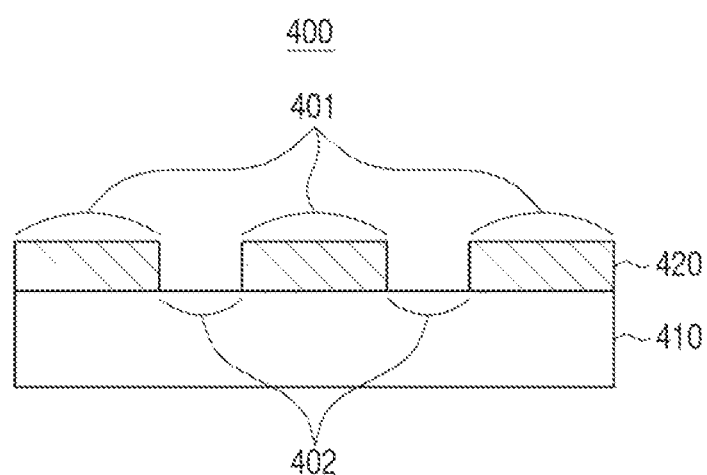

FIG. 4 is a cross-sectional view of a transparent electrode 400 according to various exemplary embodiments of the present invention.

Referring to FIG. 4, the transparent electrode 400 according to the various exemplary embodiments of the present invention includes a flexible substrate 410 and an amorphous alloy layer 420. Here, the amorphous alloy layer 420 may include a preset area that is formed in a protruding shape. In detail, the amorphous alloy layer 420 may include an amorphous alloy layer formed in a preset amorphous alloy deposition area 401 and a plurality of voids 402.

Here, the amorphous alloy deposition area 401 is an area where an amorphous alloy layer is to be formed on a surface of the flexible substrate 410. Also, the voids 402 are areas where the amorphous alloy layer is not formed on the surface of the flexible substrate 410, i.e., areas except (other than) the amorphous alloy deposition area 401. The plurality of voids 402 may be determined by patterning using a pattern defining the amorphous alloy deposition area 401.

A method of manufacturing the transparent electrode 400 according to various exemplary embodiments of the present invention by using a pattern defining the amorphous alloy deposition area 401 will be described in detail later with reference to FIG. 9. In detail, a method of manufacturing a transparent electrode according to another exemplary embodiment of the present invention will be described in detail later with reference to FIG. 10. A method of manufacturing a transparent electrode according to another exemplary embodiment of the present invention will be described in detail later with reference to FIGS. 11 through 16. A method of manufacturing a transparent electrode according to another exemplary embodiment of the present invention will be described in detail later with reference to FIG. 23.

Figure 5:
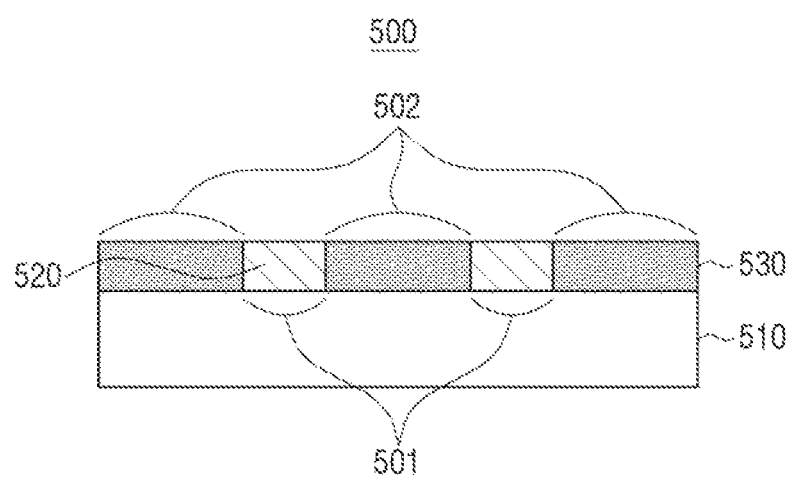

FIG. 5 is a cross-sectional view of a transparent electrode 500 according to an exemplary embodiment of the present invention.

Referring to FIG. 5, the transparent electrode 500 according to the present exemplary embodiment includes a flexible substrate 510, an amorphous alloy layer 520, and a protection layer 530. Here, the amorphous alloy layer 520 may include a preset area that is formed in a protruding shape. In detail, the amorphous alloy layer 520 may include an amorphous alloy layer formed in a preset amorphous alloy deposition area 501 and a plurality of voids 502.

Here, the protection layer 530 is used to protect the flexible substrate 510 from an etching solution and is disposed in the voides 502 that are areas except (other than) the amorphous alloy deposition area 501 formed on a surface of the flexible substrate 510. The protection layer 530 may also be formed of at least one selected from metal oxide or nitride such as silicon carbide (SiC), silicon nitride (SiN), zirconia, Al, tungsten carbide, or the like, polymer such as a polyvinyl chloride resin, a polystyrene resin, a polyethylene resin, a phenol resin, a melamine resin, or the like, ceramics such as oxide or nitride of an alloy or the like, and a metal complex.

Here, the metal complex is a complex that is produced through a combination of metal or metal ions and an organic compound or metal ions. The metal complex may be a wide range of compound such as metallocene such as $Ni(CO)_4$, $MoO_2(CH_3CHOCHOCHOCH_3)_2$, $[Cu(NH_3)_4]^{2+}$, $Rh[(C_6H_5)_3P]_3Cl$, or the like, metalloporphyrin such as chlorophyll, heme, or the like, metalloenzyme such as carboxypeptidase A or the like, or the like.

A method of manufacturing the transparent electrode 500 according to the present exemplary embodiment will be described in detail later with reference to FIGS. 17 through 22.

Figure 6:
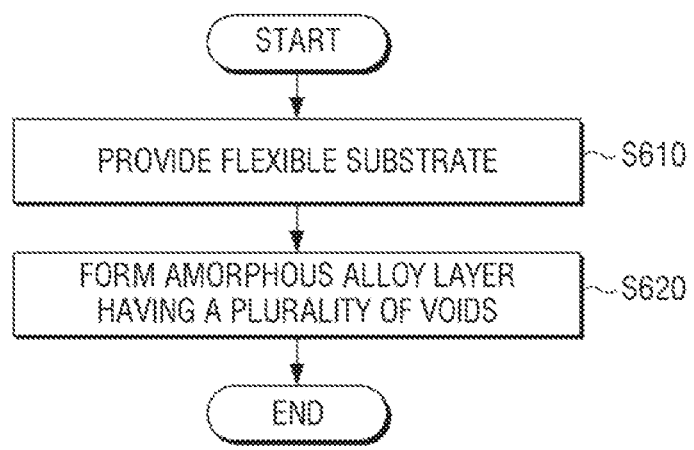
FIG. 6 is a flowchart of a method of manufacturing a transparent electrode according to an exemplary embodiment of the present invention.

FIG. 6 is a flowchart of a method of manufacturing a transparent electrode, according to an exemplary embodiment of the present invention.

Referring to FIG. 6, in operation S610, a flexible substrate on which an amorphous alloy layer will be formed is provided. In operation S620, the amorphous alloy layer having a plurality of voids is formed on an upper surface of the provided flexible substrate. Here, the amorphous alloy layer having the plurality of voids may be formed by using amorphous alloy nano-wires. Also, the amorphous alloy layer having the plurality of voids may be formed through a patterning process using a ceramic complex, a film, a mold, a mechanical method, etc.

A method of manufacturing a transparent electrode including an amorphous alloy layer formed of amorphous alloy nano-wires according to an exemplary embodiment of the present invention will be described in detail with reference to FIGS. 7 and 8.

A method of manufacturing a transparent electrode according to various exemplary embodiments of the present invention will be described in detail later with reference to FIG. 9. In detail, a method of manufacturing a transparent electrode including a patterned amorphous alloy layer according to various exemplary embodiments of the present invention will be described in detail later with reference to FIGS. 10 through 23.

Figure 7:
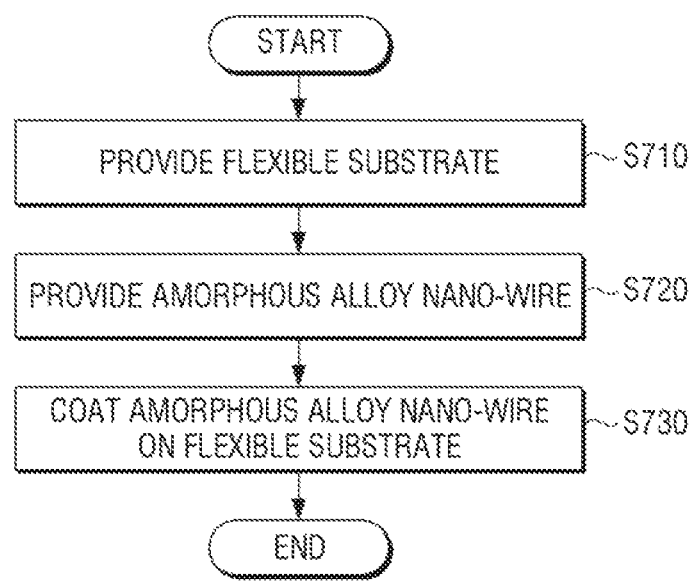
FIG. 7 is a detailed flowchart of a method of manufacturing a transparent electrode according to an exemplary embodiment of the present invention.

FIG. 7 is a detailed flowchart of a method of manufacturing a transparent electrode, according to an exemplary embodiment of the present invention.

Referring to FIG. 7, in operation S710, a flexible substrate on which an amorphous alloy layer will be formed is provided. In operation S720, amorphous alloy nano-wires are provided. Here, the amorphous alloy nano-wires may be manufactured by using amorphous alloy wires. In detail, the amorphous alloy wires may be manufactured as the amorphous alloy nano-wires by using an electrolytic polishing method. A method of manufacturing the amorphous alloy wires as the amorphous alloy nano-wires by using the electrolytic polishing method will be described in detail later with reference to FIG. 8.

In operation S730, the provided amorphous alloy nano-wires are coated on an upper surface of the flexible surface. Here, a method of coating an amorphous alloy nano-wire dispersion on the upper surface of the flexible substrate may be used. Here, the amorphous alloy nano-wire dispersion is manufactured by dispersing amorphous alloy nano-wires in a solvent, and the solvent may be or include at least one selected from deionized (DI) water, isopropyl alcohol (IPA), dimethylformamide (DMF), dichloroethylene (DCE), an alcohol group, a toluene group, and an alkyne group.

The flexible substrate that is coated with the amorphous alloy nano-wires may be dried. Therefore, an amorphous alloy layer formed of the amorphous alloy nano-wires may be formed on the upper surface of the flexible substrate.

Figure 8:
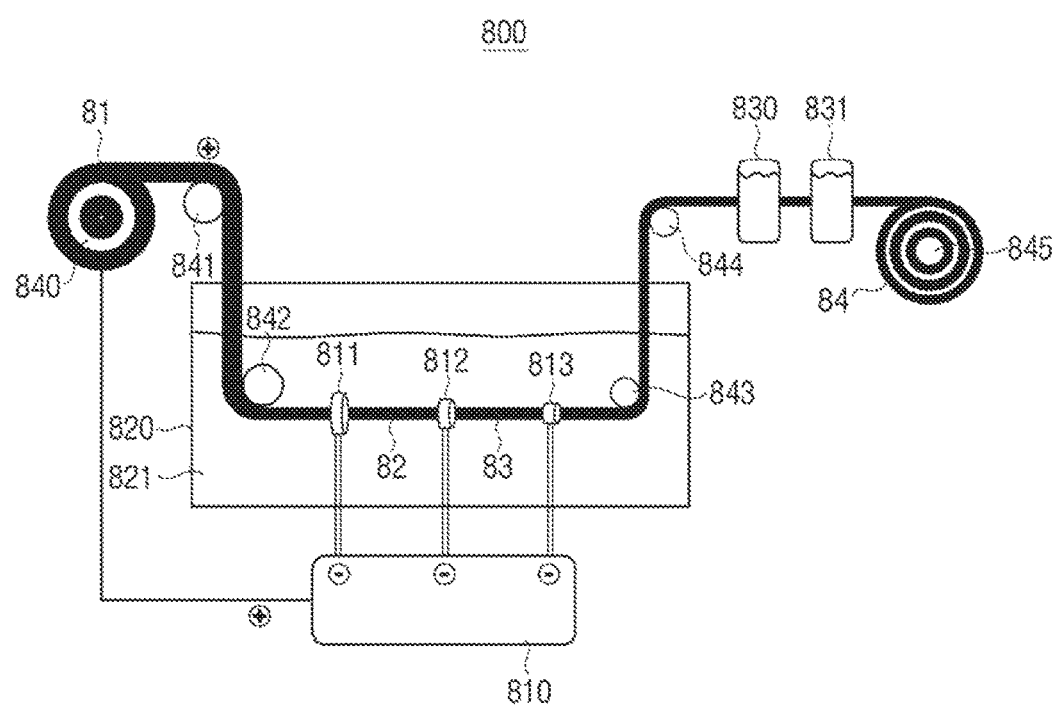
FIG. 8 illustrates a configuration of an apparatus of manufacturing an amorphous alloy nanowire used in a transparent electrode, according to an exemplary embodiment of the present invention.

FIG. 8 illustrates a configuration of an apparatus 800 for manufacturing amorphous alloy nano-wires used in a transparent electrode, according to an exemplary embodiment of the present invention.

Referring to FIG. 8, the apparatus 800 includes a power source 810, a plurality of frames 811 through 813 having preset diameters, an electrolytic bath 820, an electrolyte 821, a plurality of cleaners 830 and 831, and a plurality of rollers 840 through 845.

The apparatus 800 manufactures an amorphous alloy wire 81 by using an amorphous alloy nano-wire 82. Here, a roll-to-roll-type consecutive electrolytic polishing process may be used. For convenience of description, a roll-to-roll type is limited as being used in the above description. However, an amorphous alloy nano-wire that is manufactured in a previous process may be immediately provided to the apparatus 800. Alternatively, a manufactured amorphous alloy nano-wire may be provided so as to perform a process of cutting the manufactured amorphous alloy nano-wire to a preset length, etc., i.e., various methods may be used.

Here, electrolytic polishing is electrochemical polishing. In detail, if metal to be polished is set to an anode and immersed into an appropriate electrolyte, and a current flows between the anode and a cathode, the anode metal is melted in the electrolyte. Here, a density of the current increases in a protruding part of a surface, and thus the protruding part is melted more than other parts so as to acquire a smooth surface. Therefore, differently from mechanical polishing, a clearly polished surface may be acquired, and a complicated surface may be polished.

The amorphous alloy wire 81 is provided to manufacture the amorphous alloy nano-wire 82. Here, the amorphous alloy wire 81 may have a roll shape.

The power source 810 of the apparatus 800 may apply an anode to the provided amorphous alloy wire 81. A cathode may be applied to the plurality of frames 811 through 813 that are located in the electrolyte 820 and have the preset diameters. Here, a voltage may be about 30 V.

The electrolytic bath 820 is a container that contains the electrolyte 821. Here, the electrolyte 821 is a solution where an electrolyte or the like having an electrical conductivity and causing an electrolysis phenomenon through a flow of a current is melted in a solvent. Here, the electrolyte 821 may be one selected from nitric acid, hydrofluoric acid, sulfuric acid, phosphoric acid, acetic acid, picric acid soda, and a mixture of perchloric acid and ethyl alcohol. The electrolyte 821 may be a mixture of perchloric acid of 5 weight % (wt %) and ethyl alcohol of 95 wt %.

Also, the cathode may be applied to the plurality of frames 811 through 813 having the preset diameters by the power source 810, and the amorphous alloy wire to which a positive pole is applied by the power source 810 may pass through the plurality of frames 811 through 813 so as to polish a surface of the amorphous alloy wire.

Here, a diameter of the amorphous alloy wire 81 may be between 1 μm and 50 μm. Also, a diameter of the manufactured amorphous alloy nano-wire 82 may be greater than or equal to 10 nm and smaller than or equal to 500 nm.

For example, if the amorphous alloy wire 81 having a diameter of 1300 nm passes through the first frame 811 connected to the cathode in an electrolyte, a surface of the amorphous alloy wire 81 may be polished by electrolytic polishing to manufacture the amorphous alloy nano-wire 82 having a diameter of 900 nm. Also, if the amorphous alloy nano-wire 82 having the diameter of 900 nm passes through the second frame 812, an amorphous alloy wire 83 having a diameter of 500 nm may be manufactured through the same process. If the amorphous alloy wire 83 having the diameter of 500 nm passes through the third frame 813, an amorphous alloy nano-wire 84 having a diameter of 300 nm is finally manufactured through the same process. The number of a plurality of frames having preset diameters has been described as being 3 but may be lower than equal to 2 or higher than or equal to 4. Also, diameters of frames may be changed and realized. In addition, a voltage applied to an anode or a cathode may be changed and realized.

The plurality of cleaners 830 and 831 remove an electrolyte remaining on a surface of a manufactured amorphous alloy nano-wire. The cleaners 830 and 831 may neutralize an electrolyte that is acidic as an alkaline solution. Here, the alkaline solution may be sodium hydroxide (NaOH). The cleaners 830 and 831 may clean a surface of an amorphous alloy nano-wire by using water. The cleaners 830 and 831 may include dryers that dry the cleaned amorphous alloy nano-wire. 2 cleaners have been described as being used above, but 1 or 3 or more cleaners may be used.

The plurality of rollers 840 and 845 move an amorphous alloy wire or an amorphous alloy nano-wire so as to sequentially perform processes in the apparatus 800.

In detail, the first roller 840 may unroll a roll-shaped amorphous alloy wire connected to the anode so as to enable a process to start in the apparatus 800. Also, the second roller 841 may put an amorphous alloy wire, which is provided from an amorphous wire roll disposed in the first roller 840, into the electrolyte 821 so as to perform electrolytic polishing. The third and fourth rollers 842 and 843 may enable the amorphous alloy wire to pass through the plurality of frames 811 through 813 connected to the cathode in the electrolyte 821. The fifth roller 844 may enable an amorphous alloy nano-wire, which is manufactured through electrolytic polishing in the electrolyte 821, to be provided to the cleaners 830 and 831. The fifth roller 844 may make the manufactured amorphous alloy nano-wire into a roll shape. An amorphous alloy nano-wire has been described as being manufactured by using 6 rollers. Arrangements of rollers may be changed or the number of rollers may be changed due to an addition of a process or the like.

Figure 9:
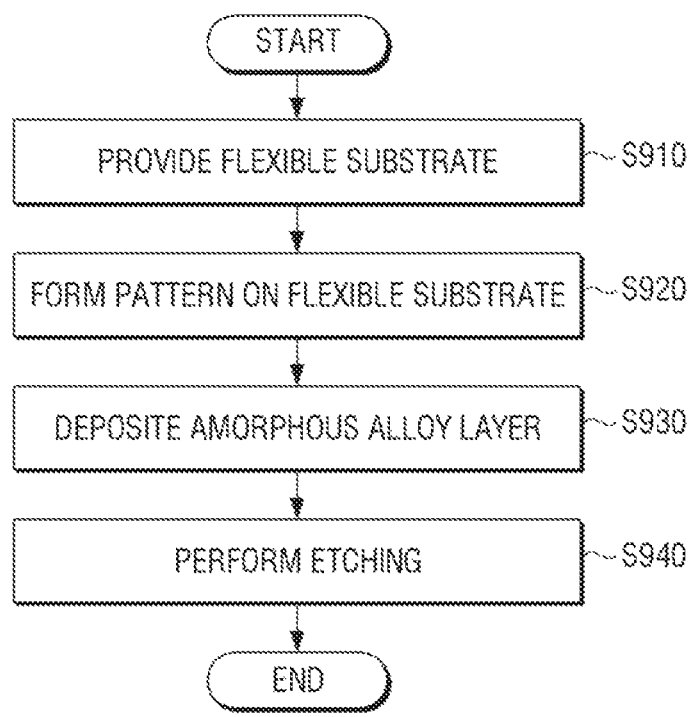
FIG. 9 is a flowchart of a method of manufacturing a transparent electrode, according to another exemplary embodiment of the present invention.

FIG. 9 is a flowchart of a method of manufacturing a transparent electrode, according to various exemplary embodiments of the present invention.

Referring to FIG. 9, in operation S910, a flexible substrate on which an amorphous alloy layer will be formed is provided. In operation S920, a pattern is formed on the flexible substrate to define an amorphous alloy deposition area. Here, the pattern may be formed by a ceramic complex, a patterned film, and a mechanical method. A method of forming the pattern will be described in detail later with reference to FIGS. 10 through 21.

In operation S930, the amorphous alloy layer is deposited on the flexible substrate on which the pattern is formed. In detail, the amorphous alloy layer may be formed on the flexible substrate on which the pattern is formed, by using a physical vapor deposition (PVD) or chemical vapor deposition (CVD).

Here, the PVD refers to a method of vaporizing metal in a vacuum to deposit vaporized metal atoms on a flexible substrate without oxidizing the vaporized metal atoms. Examples of the PVD may include vacuum deposition, sputtering, ion plating, etc.

Here, the vacuum deposition refers to a method of adhering steam of an alloy, which is generated by heating metal at a high temperature, onto a flexible substrate. The vacuum deposition has a fast deposition speed and is easily manipulated.

The sputtering refers to a kind of vacuum deposition method, i.e., a method of enabling an unreactive gas or an inert gas, such as argon (Ar), which is ionized by producing plasma in a relatively low vacuum degree, to clash with a target alloy to spurt atoms of the target alloy so as to form a film on a surface of a flexible substrate. If a reactive gas is used, a reactant between target atoms and the reactive gas may be deposited on the surface of the flexible substrate.

The ion plating refers to a new technology of vacuum deposition, i.e., a vacuum deposition method of applying positive charge to ionize steam of an alloy and biasing a flexible substrate to a negative pole so as to apply a high voltage between the alloy and the flexible substrate. According to the ion plating, a density of a formed layer may be high, and coating of a compound may be acquired.

Here, the CVD refers to a method of enabling steam of a compound of an alloy to flow around a flexible substrate keeping a high temperature to form a layer on a surface of the flexible substrate through pyrolysis or hydrogen reduction.

Here, an amorphous alloy layer may be formed at a temperature between a room temperature and 300° C. Here, the room temperature may be 25° C.

In operation S940, an area except (other than) an amorphous alloy deposition area is etched. In detail, the area except (other than) the amorphous alloy deposition area may be etched by using a chemical etching method.

Here, etching refers to a machining method using a chemical corrosive action. A necessary part may be coated to be protected from being corroded by an etching solution. However, an amorphous alloy is strong to corrosion, and thus only a material layer reacting with acid and an amorphous alloy layer formed on the material layer are removed by the etching solution. Nitric acid, hydrofluoric acid, sulfuric acid, phosphoric acid, acetic acid, picric acid soda, or the like may be used as the etching solution.

Figure 10:
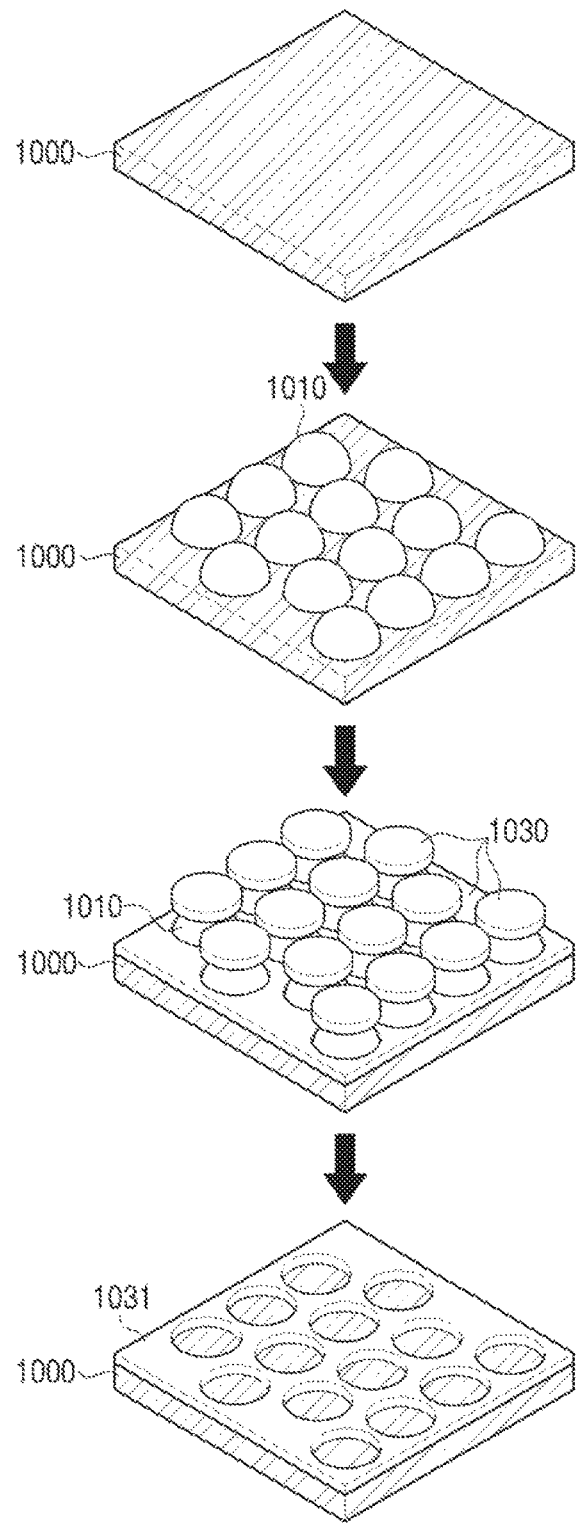
FIG. 10 illustrates a method of manufacturing a transparent electrode in detail, according to another exemplary embodiment of the present invention.

FIG. 10 illustrates a method of manufacturing a transparent electrode in detail, according to another exemplary embodiment of the present invention.

Referring to FIG. 10, in the transparent electrode according to the present exemplary embodiment, a ceramic complex 1010 is coated on a flexible substrate 1000. Here, an area of the flexible substrate 1000 on which the ceramic complex 1010 is coated is an area in which an amorphous alloy layer 1030 will not be formed. Here, the ceramic complex 1010 may be nitride or oxide of metal. In detail, the ceramic complex 1010 coated on the flexible substrate 1000 may be formed of at least one selected from ZrN, TiN, and AlN. Also, a size of each of crystal grains of ceramics of the ceramic complex 1010 may be greater than or equal to 1 nm and smaller than or equal to 1000 nm.

The amorphous alloy layer 1030 is deposited on an upper surface of the flexible substrate 1000 on which the ceramic complex 1010 is coated. Here, the amorphous alloy layer 1030 may be deposited by using PVD or CVD such as sputtering, vacuum deposition, ion plating, or the like.

The ceramic complex 1010 is etched. Therefore, the ceramic complex 1010 and an amorphous alloy deposited on the ceramic complex 1010 are removed, and an amorphous alloy layer 1031 remains only in an area where an amorphous alloy layer is to be formed.

FIGS. 11 through 16 are cross-sectional views illustrating a method of manufacturing a transparent electrode in detail, according to another exemplary embodiment of the present invention.

In detail, FIGS. 11 through 14 are cross-sectional views illustrating a process of forming a pattern defining an amorphous alloy deposition area on a flexible substrate, according to another exemplary embodiment of the present invention.

Figure 11:
FIGS. 11 through 16 are cross-sectional views illustrating a method of manufacturing a transparent electrode in detail, according to another exemplary embodiment of the present invention.

Referring to FIG. 11, a flexible substrate 1100 on which an amorphous alloy layer will be formed is provided. The method may further include a process of cleaning an upper surface of the flexible substrate 1100 on which the amorphous alloy layer will be formed.

Figure 12:
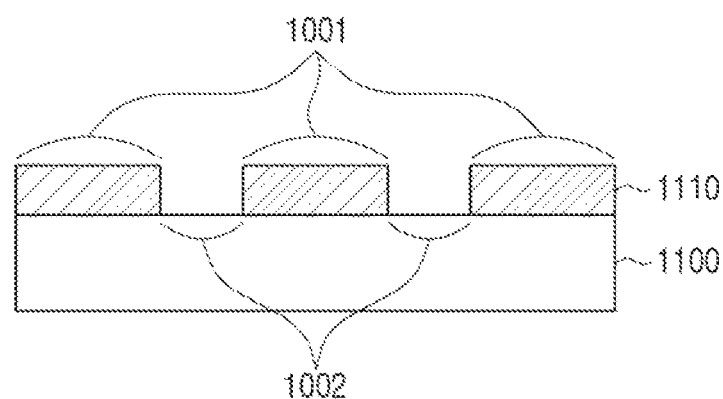

As shown in FIG. 12, a patterned film 1110 is attached onto the upper surface of the flexible substrate 1100 so as to expose an area except (other than) an amorphous alloy deposition area 1001, i.e., an area 1002 in which voids will be formed.

The amorphous alloy deposition area 1001 refers to an area in which an amorphous alloy layer is formed on the flexible substrate 1100.

The patterned film 1110 that is patterned so as to expose the area 1002 except (other than) the amorphous alloy deposition area 1001 is patterned so as to be attached onto only an area of the flexible substrate 1100 in which an amorphous alloy layer is formed when the patterned film 1110 is attached onto the upper surface of the flexible substrate 1100. Therefore, a film is not attached onto the area 1002 except (other than) the amorphous alloy deposition area 1001.

The patterned film 1110 may be formed of at least one selected from polymer and ceramics. For example, a polyester film, a polycarbonate film, glass, or the like may be used.

Figure 13:
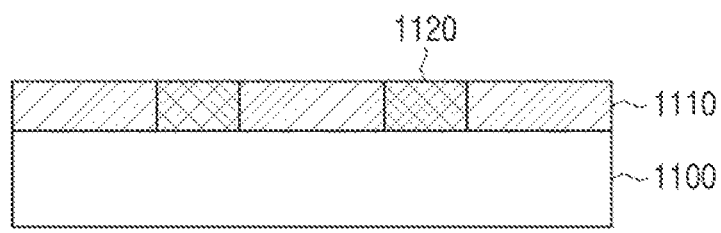

As shown in FIG. 13, a material layer 1120 reacting with acid is formed in the area 1002 onto which the patterned film 1110 shown in FIG. 12 is not attached and excludes the amorphous alloy deposition area 1001.

The material layer 1120 reacting with the acid may be etched so as to remove an amorphous alloy layer deposited in an undesired area. Most crystalline metals, such as Cu, Ni, Sn, etc., and oxide, such as silicon oxide, aluminum oxide, or the like, may be used as a material reacting with acid.

The material layer 1120 reacting with the acid may be formed by using one selected from painting, depositing, electroplating, and electroless plating.

Here, painting refers to a method of painting a coating material on a surface of a flexible substrate to form a film. The painting may acquire effects of preventing corrosive wear of the flexible substrate, increasing durability, and making a surface of an object beautiful.

Also, plating means that the surface of the flexible substrate is thinly coated with another metal. The plating is classified into electroplating that uses a principle of electrolysis and electroless plating that reduces metal by a reductant component included in a plating solution component to deposit the metal on the surface of the flexible substrate. The electroless plating makes a thickness more uniform than the electroplating.

The material layer 1120 reacting with the acid has been described as being formed by a thickness of a film as shown in FIG. 13 but may be formed thinner than the thickness of the film or may be formed to a thickness enough to cover an upper part of the film.

Figure 14:
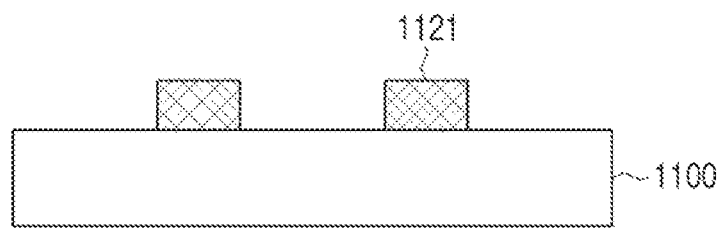

As shown in FIG. 14, the patterned film 1110 is removed. The patterned film 1110 is removed so as to enable the material layer 1120 reacting with the acid to remain only in the area 1002 except (other than) the amorphous alloy deposition area 1001. Therefore, a pattern for defining the amorphous alloy deposition area 1001 may be formed on the flexible substrate 1100.

Figure 15:
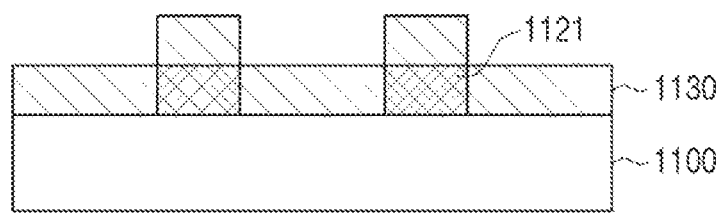

FIG. 15 is a cross-sectional view illustrating a process of forming an amorphous alloy layer on a flexible substrate on which a pattern is formed.

Referring to FIG. 15, a material layer 1121 reacting with acid is formed to form an amorphous alloy layer 1130 on the flexible substrate 1100 on which the pattern is formed. In detail, the amorphous alloy layer 1130 may be formed on the flexible substrate 1100 by using PVD or CVD such as sputtering, vacuum deposition, ion plating, or the like.

Figure 16:
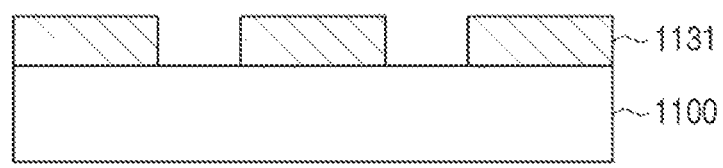

FIG. 16 is a cross-sectional view illustrating a process of etching an area except (other than) an amorphous alloy deposition area.

Referring to FIG. 16, the area except (other than) the amorphous alloy deposition area is etched. Here, a material layer that reacts with acid and is formed in the area except (other than) the amorphous alloy deposition area reacts with an etching solution and then is removed. Therefore, an amorphous alloy layer that is formed on the material layer reacting with the acid is removed together. As a result, an amorphous alloy layer 1131 may remain only in the amorphous alloy deposition area.

FIGS. 17 through 22 are cross-sectional views illustrating a method of manufacturing a transparent electrode in detail, according to another exemplary embodiment of the present invention.

In detail, FIGS. 17 through 20 are cross-sectional views illustrating a process of forming a pattern defining an amorphous alloy deposition area on a flexible substrate, according to another exemplary embodiment of the present invention.

Figure 17:
FIGS. 17 through 22 are cross-sectional views illustrating a method of manufacturing a transparent electrode in detail, according to another exemplary embodiment of the present invention.

Referring to FIG. 17, a flexible substrate 1700 including a desired area in which an amorphous alloy layer will be formed is provided. The method may further include a process of cleaning an upper surface of the flexible substrate 1700 on which the amorphous alloy layer will be deposited.

Figure 18:
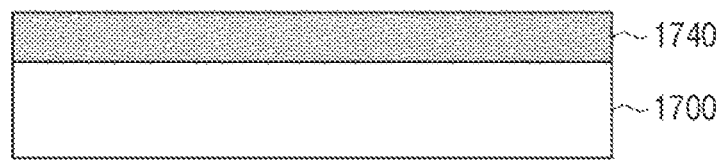

As shown in FIG. 18, a protection layer 1740 is formed on an upper surface of the flexible substrate 1700. Here, the protection layer 1740 may be formed by using one selected from painting, depositing, anodizing, and spin-coating.

Here, the anodizing refers to a method of anodizing metal to electrolyze an electrolyte aqueous solution so as to form a corrosion resistance oxide film on a metal surface. The anodizing has effects of improving an abrasion resistance, improving an adhesive force, and polishing metal to improve an external appearance.

The spin-coating refers to a coating method of dropping a solution of a material to be coated or a liquid substance on a flexible substrate and rotating the flexible substrate at a high speed to thinly spread the solution or the liquid substance. A coating thickness may be adjusted by an angular speed of the rotation of the flexible substrate and thus become thinner with an increase in the angular speed.

Figure 19:
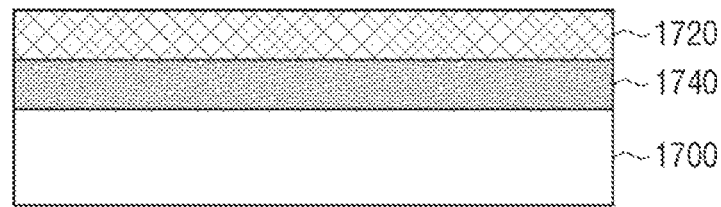

Also, as shown in FIG. 19, a material layer 1720 reacting with acid is formed on an upper surface of the protection layer 1740. Here, the material layer 1720 reacting with the acid may be subsequently etched to remove an amorphous alloy layer formed in an area except (other than) an amorphous alloy deposition area.

The material layer 1720 reacting with the acid is formed on an entire part of the upper surface of the protection layer 1740. Here, the material layer 1720 reacting with the acid may be formed by using a method such as painting, depositing, electroplating, electroless plating, or the like.

Figure 20:
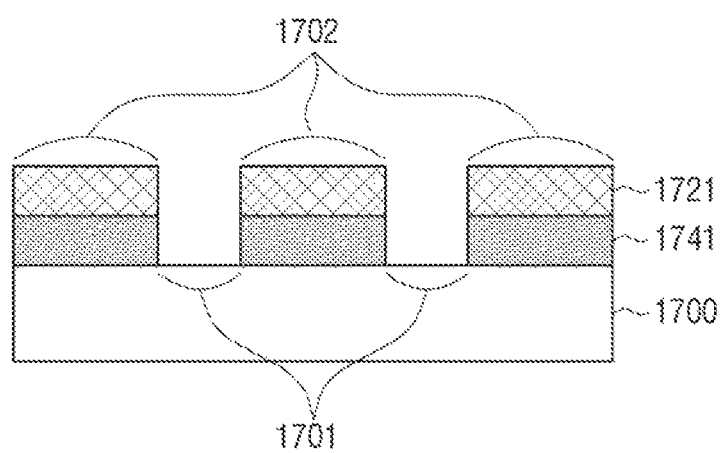

As shown in FIG. 20, the protection layer 1740 and the material layer 1720 formed on an amorphous alloy deposition area 1701 are removed. Therefore, a pattern for defining an amorphous alloy deposition area may be formed on a flexible substrate.

Referring to FIG. 20, the protection layer 1740 and the material layer 1720 formed in the amorphous alloy deposition area 1701 are removed. Also, a protection layer 1741 and a material layer 1721 formed in an area 1702 except (other than) the amorphous alloy deposition area 1701 remain on the flexible substrate 1700 so as to form the pattern.

A process of removing a protection layer and a material layer is performed by a mechanical method. In detail, the mechanical method may be one selected from dia-cutting, grinding, and laser marking.

A method of cutting a flexible substrate by using a cutting tool is referred to as cutting, and a method using a cutting tool having a tip, which cuts a flexible substrate and is formed of diamond, is referred to as dia-cutting. A dia-cut surface has a low corrosion resistance and is very vulnerable to a scratch resistant characteristic. Therefore, if an amorphous alloy layer is deposited on the dia-cut surface by using an amorphous alloy patterning method according to an exemplary embodiment of the present invention, corrosion and scratch resistant characteristics may be improved with maintaining design and metallic lustering as they are.

Also, the grinding refers to a machining method using a grinder that cuts a surface of a flexible substrate with a grinding stone rotating at a high speed. If the grinder is used, a very solid surface having a precise size may be easily polished to be smooth. Examples of the grinding stone include diamond, emery, spinel, fused alumina, silicon carbide, cubicboronnitride (CBN), etc.

Also, the laser marking refers to a method of imprinting a pattern on a surface of a flexible substrate using a laser. The laser making may be flexibly used for a wide range of flexible substrates such as semiconductor, metal, etc. in various industry environments, is conveniently used, and is economical.

Figure 21:
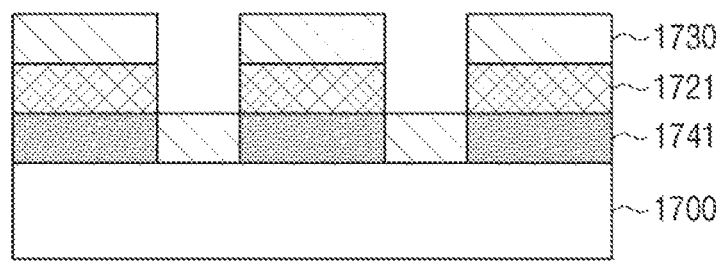

FIG. 21 is a cross-sectional view illustrating a process of forming an amorphous alloy layer on a flexible substrate on which a pattern is formed.

Referring to FIG. 21, an amorphous alloy layer 1730 is formed on the flexible substrate 1700 on which the pattern is formed, by using a mechanical method.

In detail, the amorphous alloy layer 1730 may be deposited by using PVD or CVD such as sputtering, vacuum deposition, ion plating, or the like.

Figure 22:
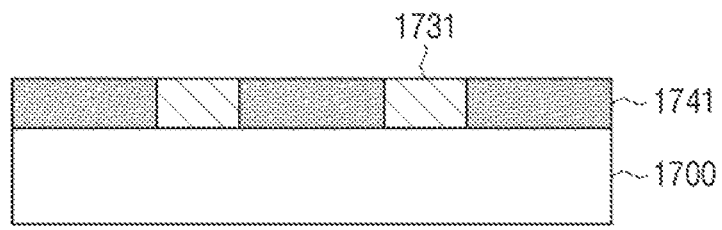

As shown in FIG. 22, a process of etching an area except (other than) an amorphous alloy deposition area may be performed.

The material layer 1721 that is formed in the area 1702 except (other than) the amorphous alloy deposition area 1701 and reacts with the acid reacts with an etching solution to be removed so as to remove an amorphous alloy layer formed on the material layer 1721 together. Therefore, the amorphous alloy layer 1731 remains only in a desired area.

As shown in FIG. 22, the transparent electrode according to the present exemplary embodiment may include a protection layer 1741. Therefore, a process of removing the protection layer 1741 may be additionally performed.

Figure 23:
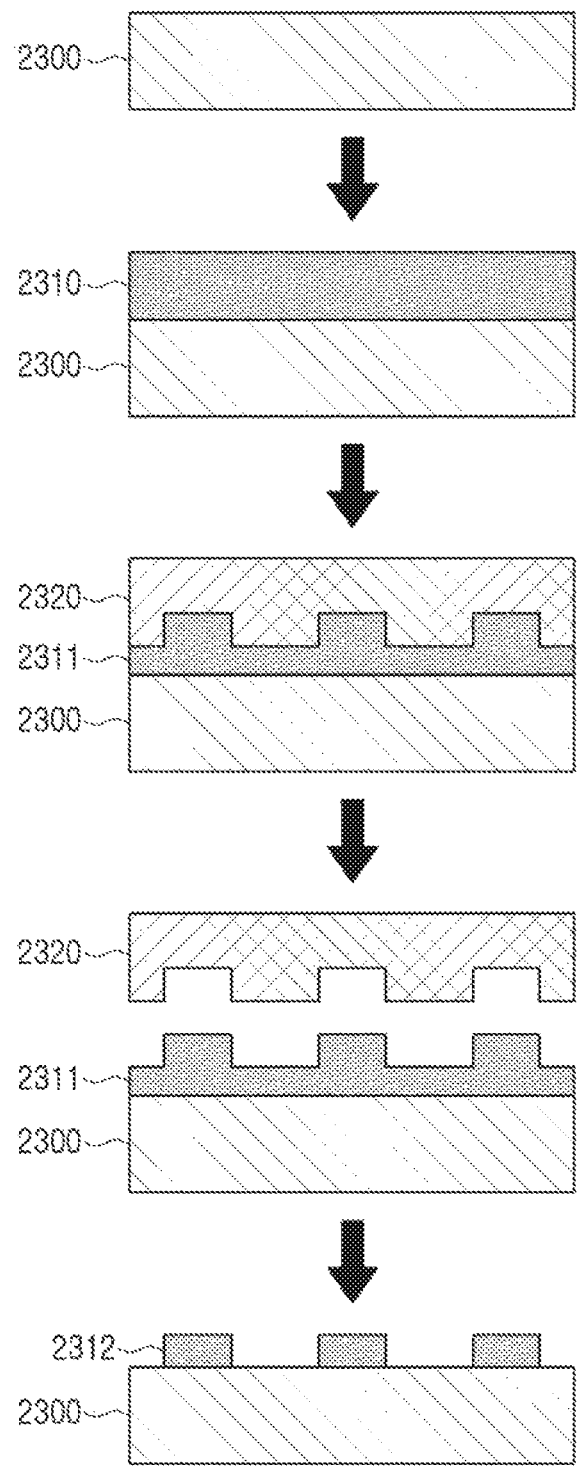
FIG. 23 is a cross-sectional view illustrating a method of manufacturing a transparent electrode in detail, according to another exemplary embodiment of the present invention.

FIG. 23 is a cross-sectional view illustrating a method of manufacturing a transparent electrode according to an exemplary embodiment of the present invention.

Referring to FIG. 23, a flexible substrate 2300 on which an amorphous alloy layer will be formed is provided. An amorphous alloy layer 2310 is deposited on the flexible substrate 2300. Here, the amorphous alloy layer 2310 may be deposited by using PVD or CVD such as sputtering, vacuum deposition, ion plating, or the like.

An area except (other than) an amorphous alloy deposition area is patterned in a protruding shape to form a mold 2320, and the mold 2320 is imprinted on the amorphous alloy layer 2310. Here, imprinting refers to a patterning technology that may imprint nano-scale pattern, etc. in large quantities by using a mold, a stamp, etc. Therefore, an area in which an amorphous alloy layer is to be formed is patterned in a protruding shape to form an amorphous alloy layer 2311.

The amorphous alloy layer 2311 on which a pattern is formed is etched. This is because an area that is patterned to protrude through an imprint process is relatively thicker than an area that does not protrude. If the patterned amorphous alloy layer 2311 is entirely uniformly etched, only an amorphous alloy layer remains in the area patterned to protrude. Therefore, an amorphous alloy layer 2312 remains only in an area in which an amorphous alloy layer is to be formed.

A transparent electrode that is manufactured by using the above-described method may be used in a flexible transparent display, a solar battery, or the like, which secures a low surface resistance, a high mechanical strength, and a stability, by using various methods.

The foregoing exemplary embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A transparent electrode comprising:
   a flexible substrate; and
   an electrically conductive amorphous alloy layer formed on the flexible substrate and having a plurality of voids,
   wherein the amorphous alloy comprises a plurality of metal atoms that are disorderedly arranged, and
   wherein the amorphous alloy has crystal grains each having a size smaller than or equal to one nanometer and an amorphous content exceeding fifty atomic percent.

2. The transparent electrode of claim 1, wherein the amorphous alloy layer is formed of a plurality of amorphous alloy nano-wires.

3. The transparent electrode of claim 2, wherein a diameter of each of the amorphous alloy nano-wires is greater than or equal to 10 nm and smaller than or equal to 500 nm.

4. The transparent electrode of claim 1, wherein the amorphous alloy layer comprises a preset area formed in a plurality of protruding shapes.

5. The transparent electrode of claim 1, wherein a thickness of the amorphous alloy layer is thicker than or equal to 5 nm and thinner than or equal to 10 pm.

6. The transparent electrode of claim 1, wherein the flexible substrate is formed of at least one selected from thin glass, fiber-reinforced plastic (FRP), polyimide (PI), and polynorbornene (PNB).

7. The transparent electrode of claim 1, wherein the amorphous alloy layer comprises a protection layer configured to be disposed in the plurality of voids.

8. The transparent electrode of claim 1, wherein an amorphous alloy comprises at least one selected from iron (Fe), copper (Cu), zirconium (Zr), titanium (Ti), hafnium (Hf), zinc (Zn), aluminum (Al), sliver (Ag), and gold (Au).

9. The transparent electrode of claim 1, wherein the amorphous alloy layer comprises an amorphous alloy complex that is formed through a reaction between an amorphous alloy and a nitrogen gas.

10. The transparent electrode of claim 1, wherein the amorphous alloy layer comprises an amorphous alloy complex, the amorphous alloy complex comprising a crystalline phase present at a content of higher than or equal to 10 atomic percent (at. %) and lower than or equal to 90 atomic percent (at. %),
   wherein a size of each of crystal grains of the crystalline phase is greater than or equal to 5 nm and smaller than or equal to 1000 nm.

* * * * *